United States Patent
Swart et al.

(10) Patent No.: US 6,271,672 B1
(45) Date of Patent: *Aug. 7, 2001

(54) BIASED BGA CONTACTOR PROBE TIP

(75) Inventors: Mark A. Swart, Anaheim Hills; Charles J. Johnston, Walnut; Gordon A. Vinther, Ontario, all of CA (US)

(73) Assignee: Delaware Capital Formation, Inc., Wilmington, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,220

(22) Filed: Aug. 26, 1998

Related U.S. Application Data

(60) Provisional application No. 60/065,771, filed on Nov. 17, 1997.

(51) Int. Cl.[7] .................................................. G01R 31/06
(52) U.S. Cl. ............................................. 324/754; 324/761
(58) Field of Search ................................... 324/72.5, 754, 324/755, 761, 762; 439/482, 842

(56) References Cited

U.S. PATENT DOCUMENTS

| | | | |
|---|---|---|---|
| 4,105,970 | * 8/1978 | Katz | 324/72.5 |
| 4,773,877 | * 9/1988 | Kruger et al. | 324/482 |
| 5,557,213 | * 9/1996 | Reuter et al. | 324/761 |
| 5,731,710 | * 3/1998 | Mizuno et al. | 324/754 |

* cited by examiner

*Primary Examiner*—Vinh P. Nguyen
(74) *Attorney, Agent, or Firm*—Christie, Parker & Hale, LLP

(57) ABSTRACT

A spring probe for performing tests on an electrical device having a plunger positioned within a barrel and including a spring in the barrel adjacent the plunger to apply a spring force against the plunger. The plunger includes a contact end having an angled surface for contacting the electrical device for applying a side load to the barrel, and a slot in the contact end for dividing the spring force upon contact with the electrical device.

10 Claims, 2 Drawing Sheets

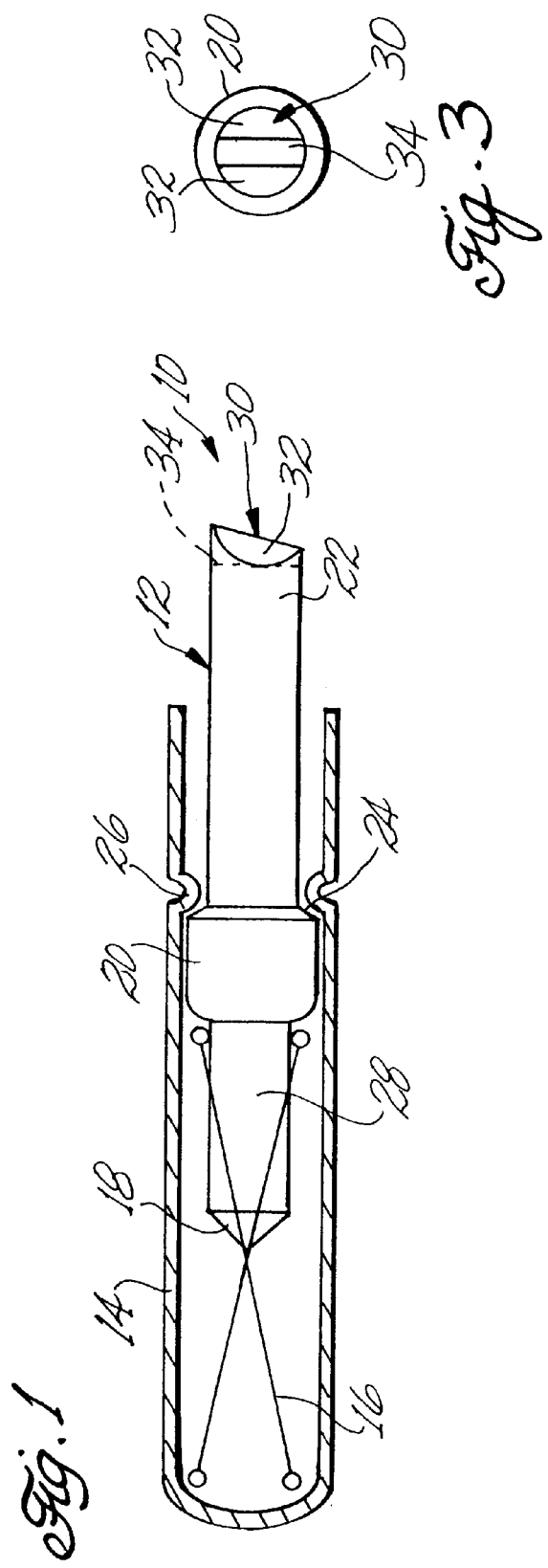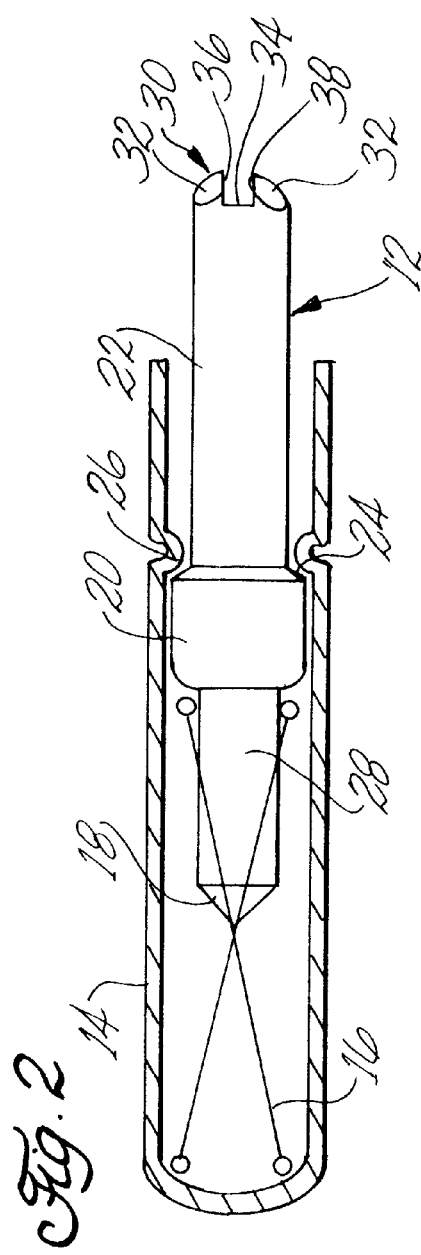

BIASED BGA CONTACTOR PROBE TIP

CROSS REFERENCE TO RELATED APPLICATIONS

This application claims priority from U.S. Provisional Application Ser. No. 60/065,771 filed Nov. 17, 1997.

FIELD OF THE INVENTION

The present invention relates to electrical contact probes and, more particularly, to a spring-loaded contact probe having a new plunger tip design used in electrical testing applications such as providing electrical contact between diagnostic or testing equipment and an electrical device under test, such as, for example, ball grid arrays.

BACKGROUND OF THE INVENTION

Conventional spring-loaded contact probes generally include an outer receptacle, a movable plunger, a barrel containing the plunger, and a spring for biasing the reciprocating travel of the plunger in the barrel. The plunger is commonly biased outwardly a selected distance by the spring and may be biased or depressed inwardly of the barrel, a selected distance, under force directed against the spring. The plunger generally is solid and includes a head or tip for contacting electrical devices under test. Such conventional contact probes are generally referred to herein as three-component probes, since they have a receptacle, barrel and plunger.

In conventional devices, the barrel is mounted within the receptacle with the plunger extending outwardly from the receptacle. Preferably, the barrel is removably mounted in the receptacle, so that should damage occur to the barrel or plunger, replacement is possible. Usually, the receptacle is permanently or semi-permanently mounted in an array within a tester. Electrical wiring may be attached to the receptacle, for electrical communication between the receptacle and the testing diagnostic equipment. Preferably, the probe member, barrel and receptacle are manufactured from electrically conductive materials, so that an electrical circuit is maintained between the electrical device under test and test equipment, by means of the contact probe.

When such electrical probes are used, generally a contact side of the electrical device to be tested is brought into pressure contact with the tip of the plunger for maintaining spring pressure against the electrical device. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring within the barrel, until an enlarged-diameter section of the plunger engages a crimped end portion of the barrel.

The process of making a conventional spring probe involves separately producing the compression spring, the barrel and the plunger. The compression spring is wound and heat treated to produce a spring of a precise size and of a controlled spring force. The plunger is typically heat treated and sometimes the barrels are heat treated. All components are subjected to a plating process to enhance conductivity. The spring probe components are assembled either manually or by an automated process. During assembly, the compression spring is first placed in the barrel, the plunger is then inserted into the barrel to compress the spring, and the barrel is roll crimped to retain the plunger. In use, the completed spring probes are commonly inserted into an outer receptacle for retaining the probe in a fixture or the like.

A problem with conventional spring probes is that for certain test sites the plunger may mark or damage the site upon contact. This problem stems largely from the material which makes up the test site, such as for example, ball grid array integrated circuits tend to have softer material comprising solder balls which constitutes the test sites.

Another problem which exists for certain convention spring probes is that a good biasing action with the inside of the barrel is difficult to form, thereby making the electrical path less efficient for transmitting the test signals to the external test electronics. Both of these problems stem from the current designs for the plunger of the spring probes.

Consequently, a need exists for an improved spring probe which eliminates the disadvantages associated with conventional spring-loaded contact probes.

SUMMARY OF THE INVENTION

Briefly, the invention comprises a newly designed probe tip configuration for a spring-loaded contact probe for performing electrical tests on a unit under test. The spring-loaded contact probe constructed according to the principles of this invention includes a plunger disposed within a barrel, or alternatively directly into a receptacle for slidable axial displacement within the receptacle. The plunger includes a tip at one end positioned outside the barrel or receptacle for electrical contact with the device under test. The plunger may have an enlarged portion along the body of the plunger for retaining the plunger within the barrel. A spring is positioned within the barrel between the enlarged portion of the plunger and the end of the barrel for applying an axial force to the plunger upon compression.

The tip of the plunger is angled which induces a side biasing action of the plunger against the inside wall of the barrel within which the plunger travels. The side biasing action ensures a good electrical path for the translation of the test signals. The plunger tip also includes a slot through the top of the plunger running along the angle. The slot reduces the force per unit area against the test site by dividing the spring force into two contact location points thus lessening the chance that the plunger tip will mark or damage the unit under test.

These and other advantages of the invention will be more fully understood by reference to the drawings and the following detailed description.

BRIEF DESCRIPTION OF THE DRAWINGS

FIG. 1 is a partial cross-sectional side view of the spring probe of the present invention;

FIG. 2 is a partial cross-sectional bottom view of the spring probe of FIG. 1;

FIG. 3 is an end view of the spring probe of FIG. 1; and

DETAILED DESCRIPTION

Figure 4:
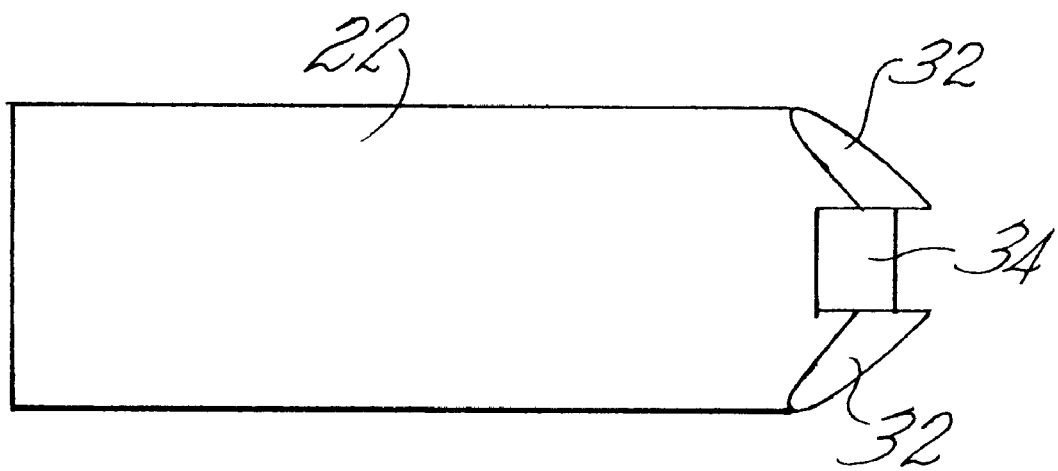
FIG. 4 is a bottom detail view of an alternative plunger tip configuration of the present invention.

The spring probe 10 of the present invention, as shown in FIGS. 1 and 2, comprises a plunger 12 mounted within a barrel 14 which may be mounted within a receptacle (not shown). The plunger 12 is mounted within the barrel 14 so that the plunger extends axially away from the barrel so that it is capable of making contact with the unit under test, and specifically with a test site. The barrel is tubular and circular in cross-section having a generally uniform diameter from end to end forming a long passage for receipt of the plunger. A spring 16 is positioned within the barrel and is axially aligned with the plunger. The spring 16 is positioned inside the hollow barrel, and depending upon the circumference of the spring against the end 18 of the plunger or as shown in FIG. 1 against the end of an enlarged body portion 20 of the plunger. The plunger 12 is typically solid and tubular and circular in cross-section having a number of varying diameters from end to end. The plunger includes a first section 22 having a diameter slightly smaller than the interior diameter of the barrel 14. First section 22 includes an angled section 24 forming a transition to the enlarged body section 20. The enlarged body section maintains the plunger within the barrel by cooperating with a roll crimp 26 on the barrel. Although a roll crimp is shown, many various configurations are possible to retain the plunger within the barrel. A tail section 28 extends from the enlarged body section 20 and has a diameter slightly smaller than the first section 22 to accommodate the spring 16.

Located on the end of the first portion 22 opposite from angled portion 24 is a probe tip 30 which extends axially away from the barrel so that it is capable of making contact with the test site on the unit under test. The probe tip 30 has an angled end portion 32 to facilitate a side biasing action of the plunger 12 against the inside wall of the barrel 14. Typically, the angle for portion 32 from top to bottom of the probe tip is 15°, although other angles are contemplated depending upon the requirements of the test site. This occurs during contact with the test site such that a portion of the axial load provided by the spring becomes a side load due to the angled contact with the test site. The probe tip 30 further includes a slot 34 cut into the plunger tip which reduces the force per unit area against the test site by dividing the spring force into two contact location points 36 and 38 during contact with the test site. Slot 34 can be perpendicular to the first section 22 of the plunger or as shown in FIG. 4 can be angled similar to the angle of surface 32 from top to bottom of the plunger. The angled end portion 32 is angled approximately 30° from contact location points 36 and 38 to each side of the plunger, respectively. Again, other degrees of angle are contemplated depending on the requirements of the unit under test.

Although the present invention has been described and illustrated with respect to two embodiments thereof, it is to be understood that it is not to be so limited, since changes and modifications may be made therein which are within the full intended scope of this invention as hereinafter claimed.

What is claimed is:

1. A spring probe for performing tests on an electrical device comprising;

a plunger;

a barrel for receipt of at least a portion of the plunger; and a spring positioned in the barrel adjacent the plunger to apply a spring force against the plunger;

said plunger having a contact end having an angled surface extending across an entire width of the contact end for contacting the electrical device for applying a side load to the barrel, and a single slot extending across an entire width of the contact end for dividing the spring force upon contact with the electrical device.

2. The spring probe of claim 1 wherein the slot is perpendicular to the plunger.

3. The spring probe of claim 1 wherein the slot has a base portion which is angled along the contact end of the plunger.

4. The spring probe of claim 1 wherein the angled surface on the contact end is 15°.

5. The spring probe of claim 1 wherein the angled surface is 30° from the slot to a side of the plunger.

6. A plunger for a contact probe comprises a contact end with at least one angled surface for applying a side load and a slot both extending across an entire width of the contact end.

7. The plunger of claim 6 wherein the slot is perpendicular to the plunger.

8. The plunger of claim 6 wherein the slot has a base portion which is angled along the contact end of the plunger.

9. The plunger of claim 6 wherein the angled surface on the contact end is 15°.

10. The plunger of claim 6 wherein the angled surface is 30° from the slot to a side of the plunger.

* * * * *

UNITED STATES PATENT AND TRADEMARK OFFICE
CERTIFICATE OF CORRECTION

PATENT NO. : 6,271,672 B1
DATED : August 7, 2001
INVENTOR(S) : Mark A. Swart, Charles J. Johnston and Gordon A. Vinther It is certified that error appears in the above-identified patent and that said Letters Patent is hereby corrected as shown below:

<u>Title page, item [54] and Column 1, line 1,</u>
The title should read -- PLUNGER TIP FOR ELECTRICAL CONTACT PROBE --.

Signed and Sealed this

Eighth Day of October, 2002

*Attest:*

*Attesting Officer*

JAMES E. ROGAN
*Director of the United States Patent and Trademark Office*